United States Patent
Kuriyama et al.

(10) Patent No.: US 6,732,909 B2
(45) Date of Patent: May 11, 2004

(54) BACKING PLATE AND ITS MANUFACTURING PROCESS

(75) Inventors: Kazuya Kuriyama, Osaka (JP); Takayuki Furukoshi, Osaka (JP)

(73) Assignee: Komatsu, Ltd., Tokyo (JP)

( * ) Notice: Subject to any disclaimer, the term of this patent is extended or adjusted under 35 U.S.C. 154(b) by 0 days.

(21) Appl. No.: 10/170,081

(22) Filed: Jun. 11, 2002

(65) Prior Publication Data

US 2002/0185521 A1 Dec. 12, 2002

Related U.S. Application Data

(63) Continuation of application No. 09/136,674, filed on Aug. 19, 1998, now abandoned.

(30) Foreign Application Priority Data

Aug. 19, 1997 (JP) ................................................ 9-238982

(51) Int. Cl.[7] ........................ B23K 20/00; B23K 28/00; C23C 14/00; C25B 11/00

(52) U.S. Cl. ..................... 228/194; 228/193; 228/262.1; 228/262.7; 228/262.71; 228/262.72; 204/298.12; 204/298.13

(58) Field of Search .................................. 228/193, 194, 228/196, 197, 183, 262.1, 262.7, 262.71, 262.72; 204/298.12, 298.13

(56) References Cited

U.S. PATENT DOCUMENTS

| | | | | | |
|---|---|---|---|---|---|
| 3,417,461 | A | * | 12/1968 | Wells et al. | 228/194 |
| 4,026,677 | A | * | 5/1977 | Galasso et al. | 228/195 |
| 4,029,479 | A | * | 6/1977 | Parker | 428/660 |
| 4,034,906 | A | * | 7/1977 | Carlson et al. | 228/194 |
| 4,988,035 | A | * | 1/1991 | Ueno et al. | 228/175 |
| 5,676,803 | A | * | 10/1997 | Demaray et al. | 204/192.12 |
| 5,693,203 | A | * | 12/1997 | Ohhashi et al. | 204/298.12 |
| 5,831,252 | A | * | 11/1998 | Shimizu | 219/117.1 |
| 5,863,398 | A | * | 1/1999 | Kardokus et al. | 204/298.13 |
| 6,073,830 | A | * | 6/2000 | Hunt et al. | 228/164 |
| 6,149,051 | A | * | 11/2000 | Vollmer et al. | 228/183 |
| 6,376,281 | B1 | * | 4/2002 | Kohler et al. | 438/118 |

* cited by examiner

*Primary Examiner*—L. Edmondson
(74) *Attorney, Agent, or Firm*—Darby & Darby

(57) ABSTRACT

A backing plate of Ti for supporting a Ti sputtering target is formed of at least two components welded together. The backing plate is welded by interposing a Cu or Zr foil or powder between faces to be welded, and then heating the assembly to a reaction temperature high enough to melt one of the Ti and Cu or Zr to produce a liquid phase. The heating temperature is retained for a time long enough to permit diffusion of the Cu or Zr into the Ti to produce a liquid phase diffusion weld. By permitting diffusion to occur, a separate metallic compound is not produced at the welding face. In effect welding is accomplished without producing a welding face, whereby no interface exists in the finished weld. The resulting weld has a strength substantially equal to the strength of the Ti material, and very good welding qualities.

4 Claims, 6 Drawing Sheets

PRIOR ART

Fig. 13

PRIOR ART

BACKING PLATE AND ITS MANUFACTURING PROCESS

This is a continuation, of application Ser. No. 09/136,674, filed Aug. 19, 1998 now abandoned. Each of the prior applications is hereby incorporated herein by reference, in its entirety.

FIELD OF THE INVENTION

The present invention relates to a backing plate and its manufacturing process for producing a sputtering target to be used in a sputtering process. The invention relates to a welding process of a Ti material which welds with high reliability and strength a titanium (hereafter referred to as Ti) material to be used suitably for the backing plate or the like.

BACKGROUND OF THE INVENTION

Sputtering is a well-known process for forming a thin film on an integrated circuit or the like. A sputtering target is used in processes of physical sputtering (PVD) and reactive sputtering. The sputtering target is composed of a target member upon which ions are impacted, and a backing plate at its rear for supporting the target member. Cooling channels between the target member and the backing plate generally carry liquid coolant to keep the operating temperature of the target within an operating range. Concretely, it is known that a specified metallic material target member is soldered to the backing plate made of a Ti material. For example, it is disclosed in Japanese Patent Application Laid Open No. 6-293963 that Ti material is used in the backing plate.

Figure 12:
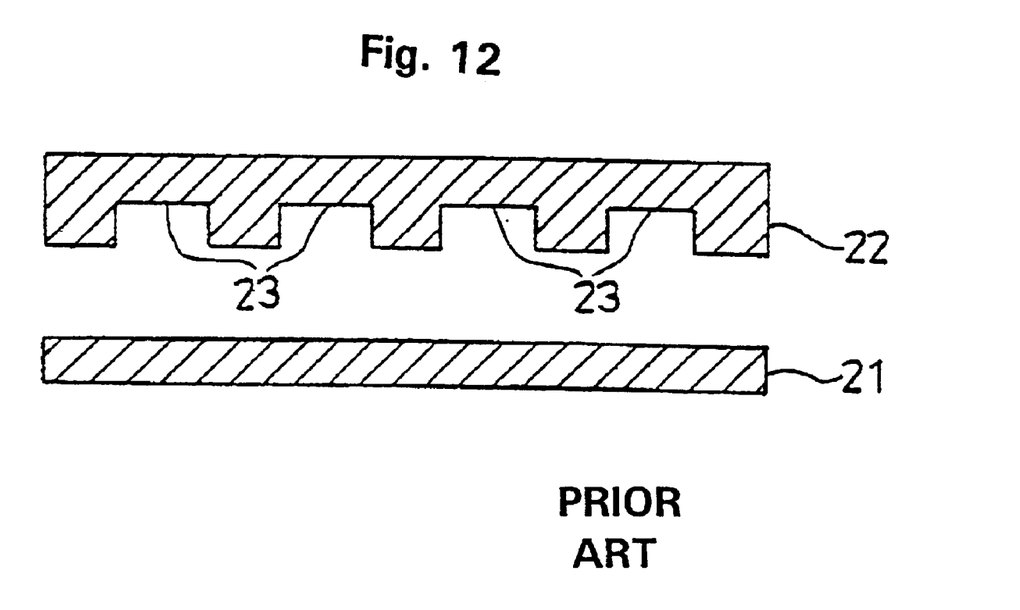
FIG. 12 is a sectional view showing the conventional example.

FIG. 12 is an exploded sectional view showing a conventional backing plate. The backing plate is composed of a substrate 21 for supporting a target member on one surface, and a cover member 22 to be affixed on the other surface of the substrate 21. The cover member 22 has groove notches 23 machined in advance on the side of the joining face to be soldered to the other surface of the substrate 21. A space defined by the grooves 23 and the facing surface of the substrate 21 forms channels for cooling water after welding of the cover member 22 to the substrate 21. The described configuration is called water-cooled jacket construction. A backing plate of the water-cooled jacket construction is disclosed in, for example, Japanese Patent Application Laid-Open No. 7-197248. The groove for forming the water channel machined in advance is disclosed in, for example Japanese Patent Application Laid-Open No. 5-132774.

Figure 13:
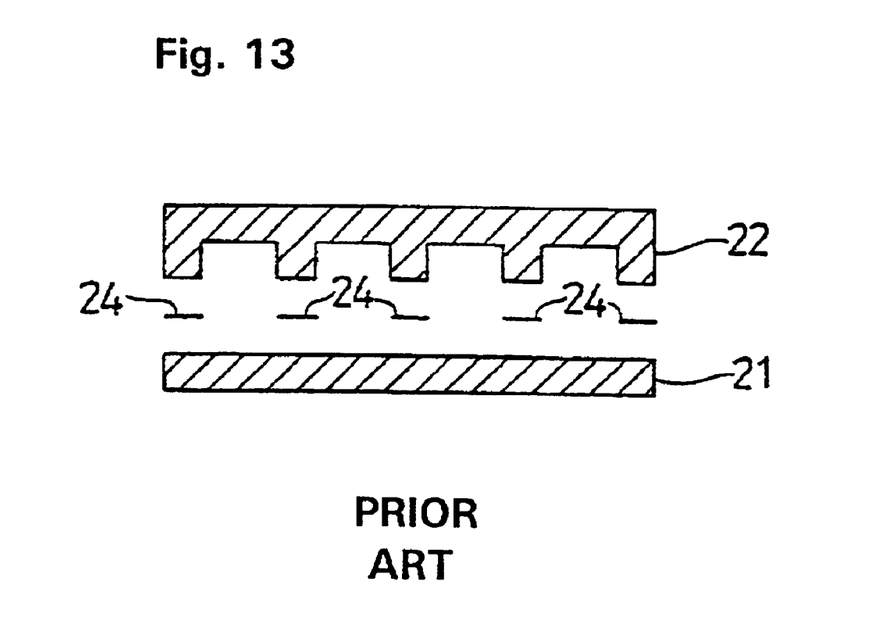
FIG. 13 is a sectional view showing the conventional embodiment.

Referring now also to FIG. 13, the joint between the cover member and the substrate 21 may be silver soldered using silver solder 24 (Japanese Patent Application Laid-Open No. 5 132774, Japanese Patent Application Laid-Open No. 3-140464).

Other methods of affixing the cover member 22 to the substrate include bolting, high-energy beam welding (Japanese Patent Application laid-Open No. 7-197248) using, for example, EBW (electron beam welding), and LBW (laser beam welding), or other conventional welding or joining processes.

In order to manufacture the backing plate with silver solder, the sealing area must be substantially larger, because the strength of silver solder is lower than that of base metal. The increased welding area requires that the backing plate must be larger in size.

If the cover member 22 is bolted to the substrate, an increased thickness is required to accommodate a screw portion in the backing plate to obtain a sufficient strength. This increases the backing plate thickness.

When the backing plate is manufactured with high energy beam welding, the specified welding strength is possible because the strength of the welded joint is almost the same as that of the base metal. But, since welding is not conducted between the facing surfaces, the possible shapes available for fabrication of the backing plate and the water channel are limited.

Machining costs for forming the groove portion 23 for the water channel in the cover member 22 increase the cost of the product.

Accordingly, an object of this invention is to provide a backing plate and its manufacturing process which can weld a plurality of components of Ti material with high reliability and strength.

It is a further object of the invention to provide a backing plate that is thinner and increases the degree of freedom of shape in the construction.

Another object of this invention is to provide a Ti material welding process which can be used preferably for manufacturing the backing plate and can weld the Ti material with high reliability and strength.

In a manufacturing process of a backing plate composed of a plurality of components, made of the Ti material, welded together, a manufacturing process of a backing plate comprises the steps of interposing a copper (hereinafter referred to as Cu) material on the welding face of the components, heating the material to a welding temperature selected to an eutectic temperature or more of Ti—Cu alloy, or preferably a decomposition temperature or more of an intermetallic compound to be formed by both of the materials so as to produce a liquid phase of the Cu material. The welding temperature is maintained long enough to permit the Cu material to diffuse sufficiently in the Ti material.

Briefly stated, the present invention provides a backing plate of Ti for supporting a Ti sputtering target. The backing plate is formed of at least two components by interposing a Cu or Zr foil or powder between faces to be welded, and then heating the assembly to a reaction temperature high enough to melt one of the Ti and Cu or Zr to produce a liquid phase. The heating is retained for a time long enough to permit diffusion of the Cu or Zr into the Ti to produce a liquid phase diffusion weld. By permitting diffusion to occur, a separate metallic compound is not produced at the welding face. In effect welding is accomplished without producing a welding face, whereby no interface exists in the finished weld. The resulting weld has a strength substantially equal to the strength of the Ti material, and very good welding qualities.

According to an embodiment of the invention, there is provided a process for joining at least two components of Ti material comprising: interposing a Cu material on a welding face between the two components, heating the two components and the Cu material to a welding temperature at which the Cu material is liquified, maintaining the welding temperature for a sufficient time to permit a substantial diffusion of the Cu material into the two components, and the substantial diffusion being sufficient to substantially remove liquid Cu material from the welding face by the diffusion of the Cu into the Ti material.

According to a feature of the invention, there is provided a process for joining at least two components of Ti material comprising: interposing a Zr material on a welding face between the two components, heating the two components and the Zr material to a welding temperature at which the Zr material is liquified, maintaining the welding temperature for a sufficient time to permit a substantial diffusion of the Zr material into the two components, and the substantial diffusion being sufficient to substantially remove liquid Zr material from the welding face by the diffusion of the Zr into the Ti material.

According to a further feature of the invention, there is provided a process for welding first and second components of Ti materials at a welding face comprising: interposing a layer of a second metallic material between the first and second Ti materials at the welding face, the second metallic material being of a type capable of diffusion into Ti materials at a reaction temperature, heating the first and second components and the second metallic material to the reaction temperature, and maintaining the reaction temperature for a sufficient time to permit a diffusion of the second material into the Ti material until substantially none of the second material remains between the first and second components.

According to a still further feature of the invention, there is provided a backing plate comprising: at least first and second components, the first and second components being of a Ti material, a first welding face on the first component, a second welding face on the second component, the first and second welding faces being welded to each other to form a weld between the first and second welding faces, and the weld including a second metallic material diffused though the first and second welding faces, and leaving substantially none of the second material between the first and second welding faces.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

In the above backing plate manufacturing process, the backing plate is heated with the Cu material interposed on the welding face. The Cu material is melted to produce a liquid phase to manufacture the backing plate using so-called liquid phase diffusion welding with the Cu material being diffused in the Ti material. The welding temperature is at least a decomposition temperature of an intermetallic compound $Ti_2Cu$ formed between the liquified Cu and solid Ti materials. Alternatively an eutectic reaction temperature or more of Ti—Cu alloy may be used. The welding temperature is retained until the Cu material is sufficiently diffused in the Ti material. Thus, the intermetallic compound which is more fragile than the Ti material does not remain in a face condition on the welded face. The Cu material diffuses and almost disappears, whereby the interface virtually does not exist. Since the welded portion is not remelted when heating is conducted again, the strength of the welding material is almost equal to that of the Ti material. Thus, the welding strength is improved as compared with silver soldering, and the area of welded surface is improved as compared with the high energy beam welding. This also permits making the welding portion of the backing plate thinner as compared with that possible when the joining is by bolting.

Although the foregoing description supposes that diffusion is continued until virtually no liquid copper remains at the interface, in fact, applications may make it desirable to permit at least some copper to remain at the interface. The claims must be interpreted in this light.

The Ti material to be used above includes pure Ti for industry use, and Ti alloy for industry use. Concretely there can be Ti-5Al-2.5Sn (residue is inevitable impurity and Ti by weight %, hereinafter the same) Ti-6Al-4Zr-IV, Ti-8Al-1Mo-1V, Ti-8Al-12Zr, Ti-3Al-2.5V, Ti-8Mn, Ti-4Al-4Mn, Ti-6Al-4V, Ti-7Al-4Mo, Ti-3Al-11Cr-13V and so on. The Cu material includes pure Cu for industry, and Cu alloy for industry.

The whole component is preferably heated to produce the weld. Heating in this manner reduces residual stress remaining near the welding face, and the Ti material is softened and flowed on the lowermost face, whereby the backing plate remains substantially undistorted.

Although the manufacturing process can be conducted in the ambient atmosphere, the cleanliness of the backing plate is improved by conducting the welding process in a vacuum, inert gas or reducing gas atmosphere. Also, if welding is performed in the ambient atmosphere, when the backing plate is used in a sputtering operation in superhigh vacuum, outgassing from the backing plate is increased. If the welding is done in a vacuum or an inert atmosphere, outgassing from the backing plate is reduced during sputtering and results in better sputtering. Concretely, it is preferable to conduct in welding in a vacuum of $10^{-3}$ Torr or less.

Although the Cu material to be used in the manufacturing process can be in any form, it is preferable to use the Cu material of foil or powder, whereby the handling and the interposing operation to the welding face are simplified. For example, when the Cu foil is used, the foil thickness should be within the range of 10 $\mu$m through 100 $\mu$m. It is confirmed that there is no difference in the welding strength within the range of 18 $\mu$m through 60 $\mu$m. Generally the Cu foil of 18 $\mu$m through 30 $\mu$m is easily available. When powdered Cu is used, instead of Cu foil, Cu powder particle sizes between about 25 $\mu$m through 30 $\mu$m diameter should preferably be used. The powder layer thickness should preferably be approximately 100 $\mu$m. Although it can be possible to use a thinner layer, this may increase the time required to do the interposing operation. It is relatively easy to increase the thickness. A maximum thickness of up to 1 mm is permissible. When a particular component has a plurality of welding faces in one plane, the operation can be easier to do by applying the Cu material over the whole of one plane face. The Cu material that is outside the welding area does no harm, and any Cu that is not diffused into the Ti material can be ignored. The amount of the Cu material used can be minimized, if necessary, by interposing the Cu material only between the faces that will be welded.

When foil is used, the welding faces of the Ti material and the surfaces of the foil should be de-greased and washed with an organic solvent like alcohol or acetone. Or the surface roughness should be approximately "∇" working (35 s through 100 s) or should be a little coarse. High surface precision is not required, because close adherence between the Ti material welding face and the foil surface is not important. The foil becomes molten and enters the liquid phase, and thereafter diffuses into the Ti material.

Although the welding faces can be welded using pressure applied in a direction near the welding areas, it is preferable to not require the application of pressure from the point of view of the simplification of the welding apparatus. But where there is camber in faces of the Ti material, it should be desirably pressed so that the planarity becomes approximately 1.0 mm or less.

The welding temperature, which is a decomposition temperature of intermetallic compound or more, or an eutectic reaction temperature, should be either at or below a melting point of the Ti material. This limits the maximum welding temperature to about 1670° C. For pure Cu material, the welding temperature should preferably be above about 887° C. For Cu material containing commonly found impurities, the welding temperature should preferably be above about 887° C. The welding temperature should more preferably remain within the range of approximately 990° C. through 1670° C.

Although it is possible to conduct a better welding operation when the diffusing time is sufficient to obtain welding at the eutectic reaction temperature (approximately 887° C.), the welding temperature of approximately 990° C. or more should be adopted in practical use. A first reason for the higher temperature is because it is desired to modify the pure Ti to β phase to achieve welding in a reasonable time. But in practical use, welding at the eutectic temperature does not achieve a sufficiently high diffusion rate. Although the modifying point from the α phase of the pure Ti to the β phase is approximately 885° C., the modifying point is assumed to be approximately 930° C. through 940° C. in the Ti for industry where some impurities are allowed to be contained. A second reason is because the decomposition temperature or more of the intermetallic compound should preferably be higher to prevent the intermetallic compound from remaining at the welding face.

The decomposition temperature of the TiCu, which is the intermetallic compound, is approximately 975° C. and the decomposition temperature of $Ti_2Cu$ is approximately 990° C. Accordingly, the welding temperature should be preferable to be at least 990° C. The top limit is selected as approximately 1670° C., because the melting point of the Ti is approximately 1668° C. Thus, in the above temperature range, the diffusing operation can be caused in the Ti material by causing a liquid phase of Cu in a condition where an intermetallic compound is not produced. The resulting welding strength is almost the same as that of the Ti material by using liquid phase diffusion welding. This increased strength results from the fact that the interface hardly exists in the welding portion. Improved welding efficiency of 90% or more can be realized. Absolutely constant temperature during welding is not required. Some fluctuation is permissible within the temperature range.

The welding time required is that which is sufficient for the Cu material to diffuse into the Ti material and for the liquid phase to disappear. The welding time should be preferably 600 seconds or more, although the welding time is selected in accordance with the thickness of the interposed Cu material. The welding time of 600 seconds is based on the use of a 10 μm Cu foil. If thicker foil or powder thickness is used, the welding time is adjusted accordingly.

In a manufacturing process of a backing plate composed of a plurality of components, made of Ti material, welded to each other, the backing plate manufacturing process according to the invention also includes the steps of interposing zirconia (hereinafter referred to as Zr) material on the welding face of the components, heating the material to a welding temperature selected at a decomposition temperature or more of an intermetallic compound that is formed by the two materials so as to cause a liquid phase of the Zr material. The welding temperature is maintained for a time long enough so that the Zr material is diffused sufficiently into the Ti material.

In the manufacturing process of the invention, the welding operation is conducted with Zr material on the welding face, whereby the same welding effect is accomplished as when using the Cu material.

Since the backing plate manufactured by the manufacturing process of the invention is welded using a plurality of components by liquid phase diffusion welding, the welding strength and welding area between the components are improved more than before. Even in a backing plate where a plurality of components composed of the Ti material are face-welded, for example, by interposing a Ti material on the welding face, the welding strength and the welding area between the components are improved more than before.

A weld, as described above is obtained if the area of the welding portion is reduced by improvements in the welding strength and the welding area. In the backing plate of water-cooled construction using the three-layer construction of the invention, the substrate of the block member for producing the cooling water channels and the welding area to the cover member can be made smaller. The thickness of the water channel portion can be reduced while obtaining the same capacity of water cooling as before by correspondingly reducing the thickness. Thus, the whole backing plate and the welding portion can both be made thinner. Thus, high permeability of the magnetic field from the magnet positioned behind the backing plate can be achieved, whereby better sputtering can be realized.

The engraving work by machining on the cover member is not required as before, because of the three-layer construction. Thus, the manufacturing cost is reduced, the water channel is easier to form, and the degree of freedom of the water channel design is increased. That is, even a water channel having a complex shape, as aforementioned, can be realized easily by building the block member by combining members of comparatively simple shapes. The cooling water flow becomes turbulent because of the complex water channel formed. The difference in the temperature distribution of the cooling water within the water channel is reduced, thus improving the cooling performance. Further, the component yield is improved by dividing the structure into more components. The invention also includes the backing plate (the cover member and the block member integrally formed) of a conventional two layer construction, but using the welding technique of the invention.

By integrally forming the cover member and the block member by pressing the one piece of plate-shaped body, the structure can be easily made even if the shape is relatively complex, and the cost is reduced by increasing the design freedom of the water channel shape. The integrally formed cover member and the block member can be made thinner, the weight reduced and the high permeability of the magnetic field can be improved.

A welding process of the Ti material according to the invention comprises the steps of interposing Cu material on the welding face of the Ti material, heating the material to a welding temperature selected to be an eutectic temperature or more of Ti—Cu alloy, or a decomposition temperature or more of an intermetallic compound of the two metals so as to produce a liquid phase of the Cu material, and maintaining the welding temperature while the Cu material diffuses sufficiently into the Ti material.

In the welding process of the Ti material of the invention, the Ti material is heated with Cu material interposed on the welding area. The Cu material becomes molten to cause a liquid phase to weld the Ti material by liquid phase diffusion welding for welding by diffusing the Cu material into the Ti material. The welding temperature is an eutectic temperature or more of Ti—Cu alloy, or preferably a decomposition temperature or more of an intermetallic compound formed with the Ti material and the Cu material, and the welding temperature is retained while the Cu material diffuses sufficiently into the Ti material. Thus, the intermetallic compound which is more fragile than the Ti material does not remain on the welding portion. That is, the Cu material diffuses into the Ti material and almost disappears, whereby the interface does not exist. The welding portion does not become molten upon reheating. The strength of the welding portion is almost equal to that of the Ti material. Thus, the welding strength is improved as compared with silver soldering, and the welding area is increased as compared with the high energy beam welding. Also, the backing plate thinner as compared with the bolting.

By heating the whole Ti material to be welded, residual stress is prevented from remaining near the welding area, and the Ti material is softened and flowed on the lowermost face, whereby the Ti material after welding remains substantially undistorted.

Although the welding process can be conducted in the ambient atmosphere, the cleanliness of the Ti material after the welding is improved by conducting the welding in a vacuum, in inert gas or in a reducing gas atmosphere. When a backing plate for use in a sputtering process is manufactured by welding in a vacuum or inert atmosphere, the amount of outgassing from the backing plate in the superhigh vacuum of the sputtering process is reduced, whereby better sputtering can be realized.

For the Cu material to be used in the welding process, although it is in any embodiment, the Cu material of foil or powder can be preferably used, whereby the handling and the interposing operation to the welding face are simplified. The welding temperature is at least a decomposition temperature of the intermetallic compound, and preferably higher, but should remain at or below the melting point of the Ti material. The welding temperature should preferably stay within the range of approximately 887° C. through 1670° C., but more preferably in the range of approximately 990 to 1670° C., and the welding time should preferably be 600 seconds or more.

Figure 1:
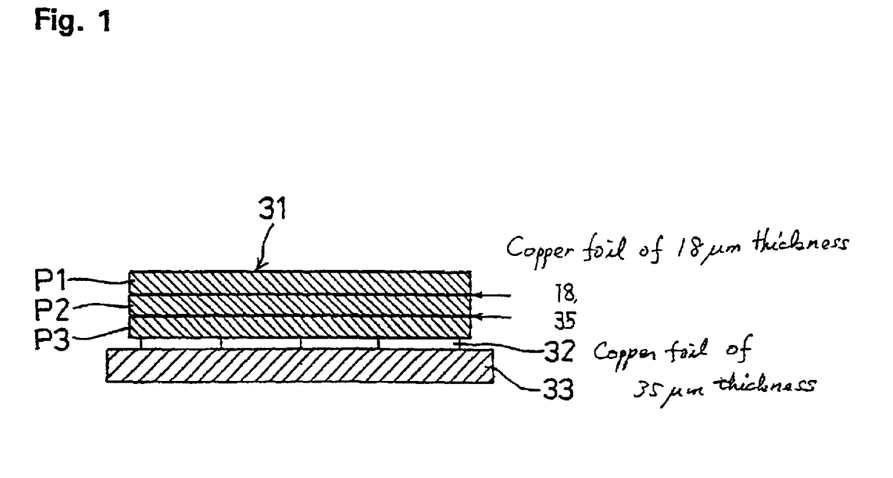
FIG. 1 is a side sectional view showing the construction of a test piece to be used in the diffusion welding test.

Referring to FIG. 1, three plates P1, P2 and P3 of Ti (pure Ti for industry) 300 mm×300 mm×6 mm were prepared. A diffusion welding test was conducted using a test piece 31 of a Cu foil (pure Cu for industry) of 18 μm thickness interposed between the Ti plates P1 and P2. A Cu foil of 35 μm thickness was interposed between the Ti plates P2 and P3. The Ti plates P1 through P3, were washed with isopropyl alcohol, were not pressed with a jib or the like, but were merely superposed and held down with their own weight. The test piece 31 was placed on a ceramic plate 32 resting on a carbon tray 33.

Figure 2:
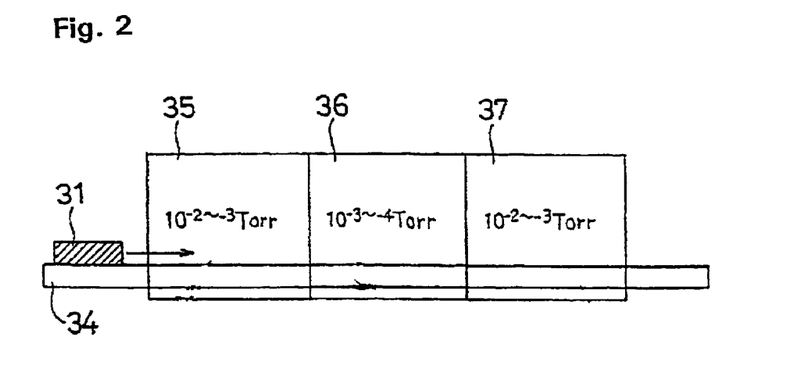
FIG. 2 is a schematic view of a model three-chamber type vacuum furnace using the diffusion welding test.

Referring to FIG. 2, heat treatment of the assembly of FIG. 1 was conducted using a transverse three chamber type vacuum furnace. The test piece 31 was carried by a conveyor 34 through, in order, a heating chamber 35, a treating chamber 36 and a cooling chamber 37. In the heat treating conditions, the test piece 31 was heated for about 70 minutes at a heating rate of 15° C./minute to a temperature 1020° C. The test piece 31 was retained in the heating chamber 35 for one hour. The test piece 31 was furnace-cooled as low as 500° C. and then was cooled below 500° C. using $N_2$. The test piece 31 was moved at 500° C. because of the three-chamber type vacuum furnace. After heating in the heating chamber 35, the test piece 31 was moved to the treating chamber 36 when the temperature reached 500° C. in the heating chamber 35. For cooling, the test piece 31 was moved to the cooling chamber 37 when the temperature in the treating chamber 36 reached 500° C. The vacuum was maintained at approximately $10^{-2}$ to $10^{-3}$ Torr in the heating chamber 35 and the cooling chamber 37, and approximately $10^{-3}$ to $10^{-4}$ Torr in the treating chamber 36.

Figure 3:
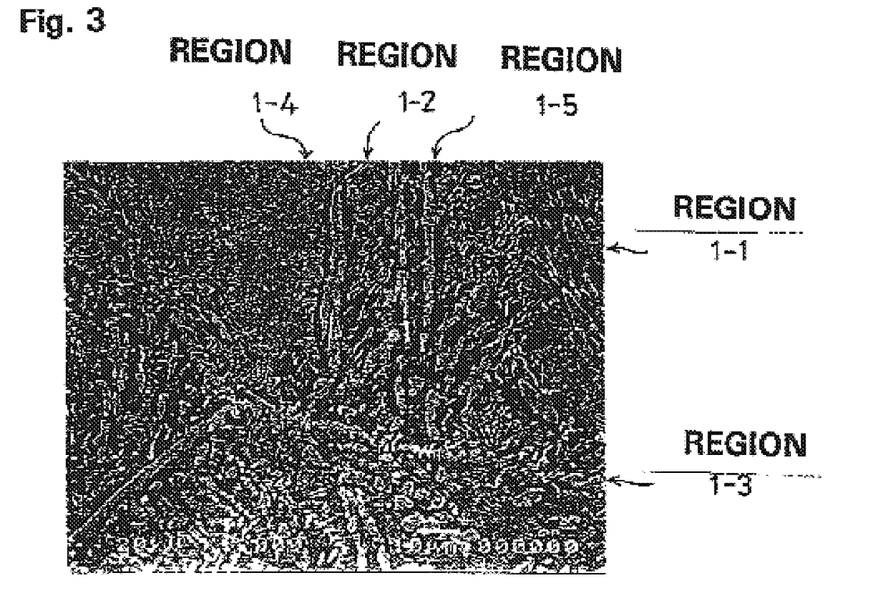
FIG. 3 is a microphotograph showing the metallic structure near the welded face when the test piece is heated to 1020° C. and is retained.

FIG. 3 is a microphotograph showing the metal structure near the welding face produced by the diffusion welding test with the structure heated up to the welding temperature of 1020° C. Table 1 shows the results of the qualitative analysis (EDAX) of the metal structure of each region.

TABLE 1

| Region | Ti (wt %) | Cu (wt %) |
| --- | --- | --- |
| 1-1 | 75.19 | 24.81 |
| 1-2 | 88.06 | 11.94 |
| 1-3 | 75.69 | 24.31 |
| 1-4 | 95.52 | 4.48 |
| 1-5 | 99.30 | 0.70 |

When the ratio of the weight % between Ti and Cu was approximately 60:40, it was considered that the metallic compound $Ti_2Cu$ existed. As shown in Table 1, Ti:Cu≈approximately 75:25 even in the regions 1-1, and 1-3 where the ratio of Cu was relatively high. It was confirmed that Cu was sufficiently diffused to Ti, and large $Ti_2Cu$, which would reduce the strength, was absent. $Ti_2Cu$ could exist regions where the analysis was not conducted. In this case, it was not proved that the intermetallic compound existed in, for example, laminations on the whole welding face, and was dotted, thereby hardly influencing the welding condition.

It was confirmed that the test piece after treating had a welding strength of 250 N/mm² shear strength, and 350 N/mm² tensile strength at room temperature. The welding strength was almost the same as that of Ti material which was the base metal. When silver soldering was used, the welding strength was 159 N/mm² shear strength, and 230 N/mm² tensile strength. With the present invention, the welding strength was improved. It was confirmed that the welding efficiency of the Ti plates P1 and P2 was approximately 90%, and the welding efficiency of the Ti plates P2 and the P3 was 99% or more. The planarity was approximately 1.5 mm before welding, but after welding, the planarity was confirmed to be improved by approximately 0.5 mm.

COMPARATIVE EXAMPLE

Figure 4:
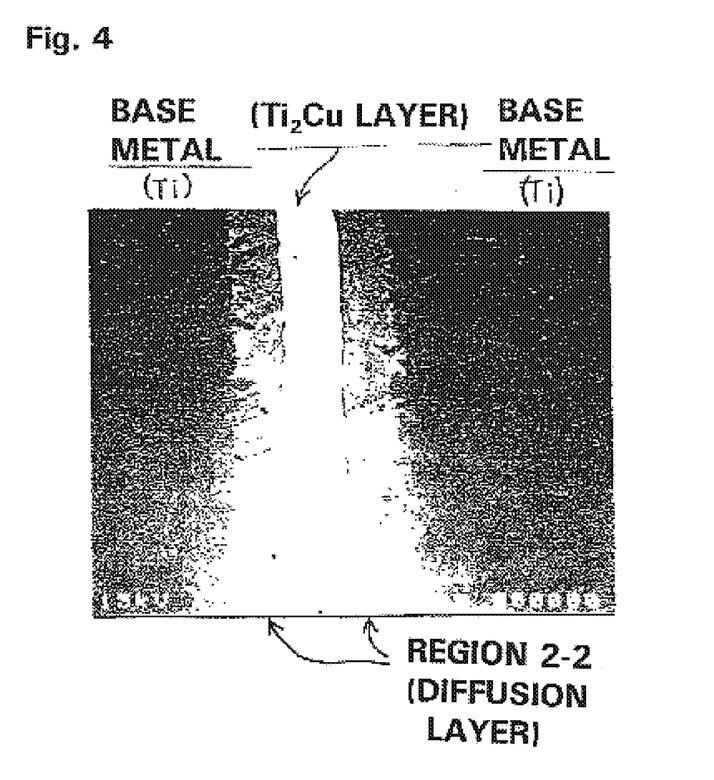
FIG. 4 is a microphotograph showing the metallic structure near the welded face when the test piece is heated to 950° C. and is retained for one hour.

A diffusion welding test was conducted using the aforementioned test piece 31 under the same conditions as the diffusion welding test, except for the heating up to the welding temperature 950° C. (below the decomposition temperature of 975° C. FIG. 4 is a microphotograph showing the metallic structure near the welding face when the diffusion welding test for heating to 950° C. was conducted. Table 2 shows the result of the qualitative analysis of the metallic structure in each region.

TABLE 2

| Region | Ti (wt %) | Cu (wt %) |
| --- | --- | --- |
| 2-1 | 63.52 | 36.48 |
| 2-2 | 76.89 | 23.11 |

Although the region 2-2 is a diffusion layer, the region 2-1 was considered to be $Ti_2Cu$ layer. It was confirmed that the $Ti_2Cu$ lamination existed in the layer across the whole welding face, and the welding portion was too fragile. With the welding temperature 900° C., it was confirmed that it was required to retain the test piece 31 under heat treatment for 166 hours to obtain a welding condition as good as in the embodiment. Also, it was confirmed that there were mixed results with a welding temperature 950° C. In some cases the results were better welding condition, and in other cases the welding condition could not be obtained.

Figure 5:
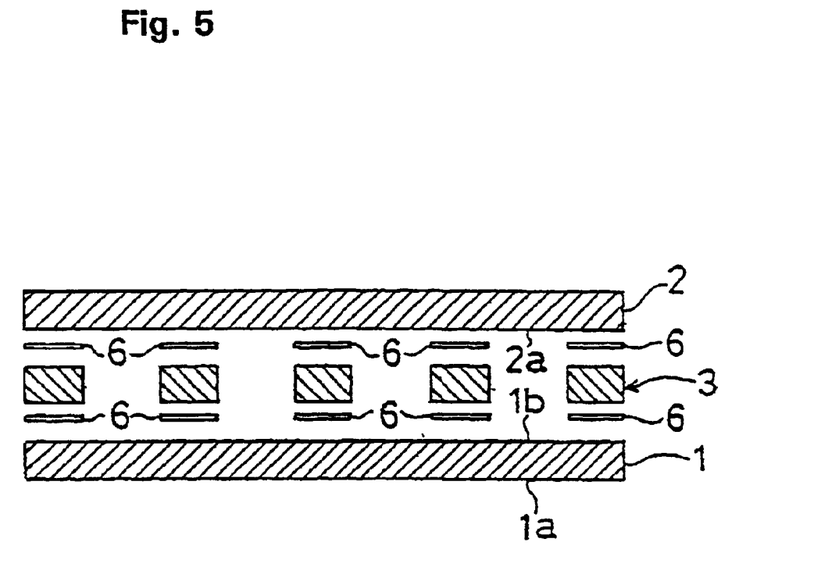
FIG. 5 is a transverse exploded sectional view showing a backing plate in one embodiment of this invention.
Figure 6:
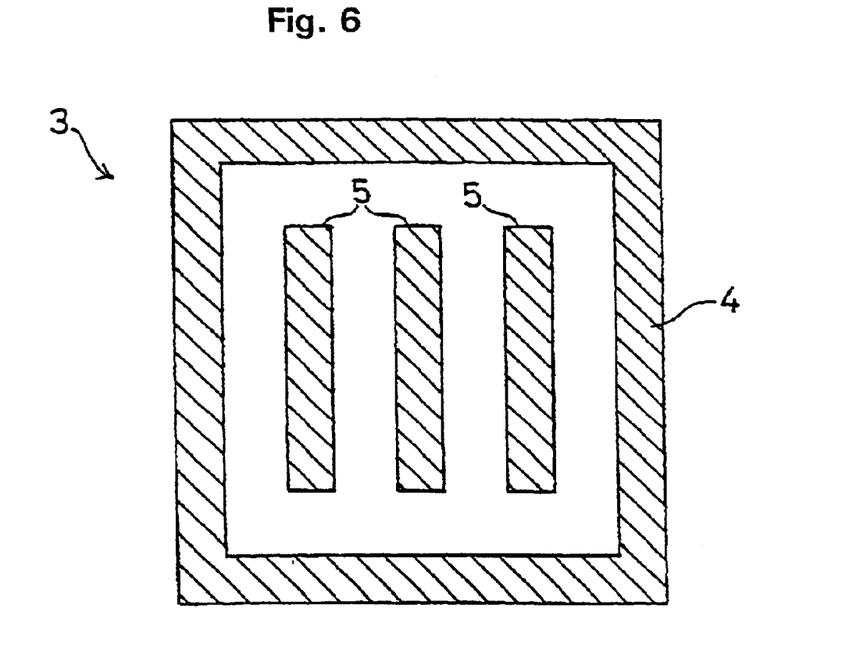
FIG. 6 is a central axial cross section of the backing plate of FIG. 5.

Referring now to FIGS. 5 and 6, a manufacturing process of the backing plate using the above welding process will be described. The backing plate was a three-stage jacket in construction. Roughly, the substrate 1, the cover member 2 and the block member 3 are welded. The substrate 1 has a target member on one surface 1a. A cooling water channel is formed between the cover member 2 and the block member 3. The cover member is welded on the rear surface 1b of the substrate 1. The block member 3 is comprised of an outer frame member 4 and three compartment members 5.

The members 5 were welded with the aforementioned welding process with the Cu foil 6 respectively interposed between the rear surface 1b of the substrate 1 and the block member 3. In addition Cu foil 6 is interposed between an inner surface 2a of the cover member 2 and the block member 3. Thus, better welding operation with improved welding strength and welding area was obtained.

By improving the welding strength and the welding area in this way, a strength at least equal to a conventional structure can be obtained even if the area of the welding face reduced. Thus, the welding area to the substrate 1 of the block member 3 and the cover member 2 can be smaller, and the thickness of the water channel portion can be made thinner while retaining the cooling water amount equal to that of the conventional device by reducing the corresponding thickness. The thickness of the welding portion does not need to increase, as when attachment by bolting is used, and the welding portion can also be made thinner. Thus, the whole backing plate can be made thinner. Thus, the high permeability of the magnetic force from the magnet positioned in the back portion of the backing plate can be achieved, whereby better sputtering can be realized.

Figure 7:
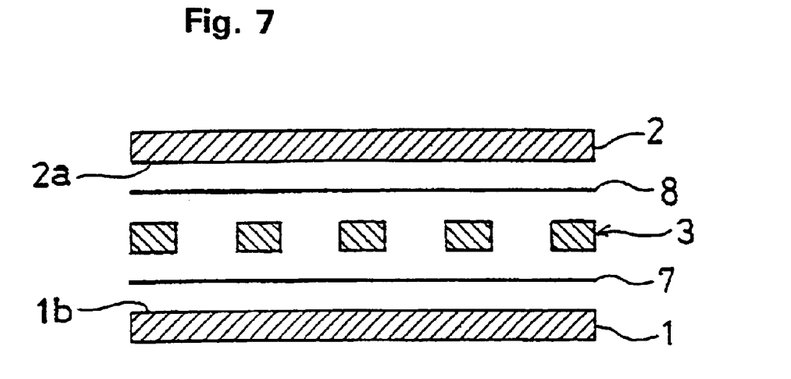
FIG. 7 is a transverse exploded sectional view showing another embodiment of the invention.
Figure 8:
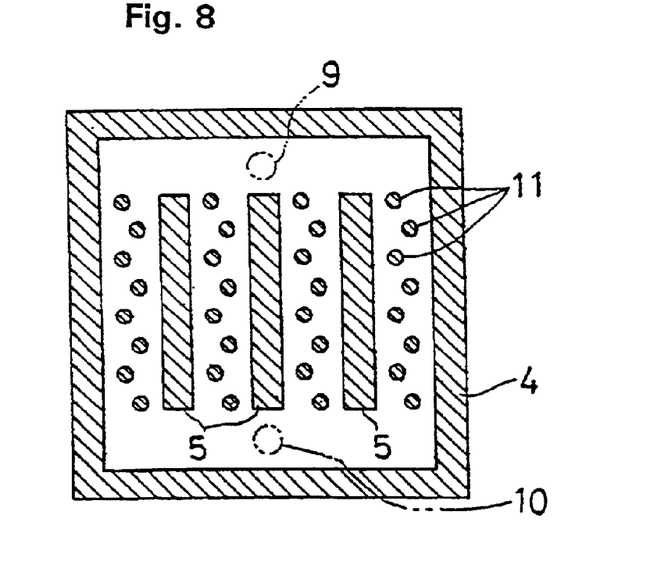
FIG. 8 is a central axial cross section of the embodiment of FIG. 7.

Referring now to FIGS. 7 and 8, when a plurality of welding faces exist on one plane as on the rear surface 1b of the substrate 1 and inner surface 2a of the cover member 2 as shown in FIG. 5, the Cu foil 7 may be made large enough to cover the entire surfaces 1b and 2a. This is possible because the Cu which does not contribute directly towards the welding is diffused into the Ti and does not remain as a Cu layer on the surface. Thus, the portions of Cu lying between mating parts enter the welding process, and the portions not contributing to the welding process effectively disappear by diffusion. The operation is simplified as compared with a case where the individual provision is conducted as in FIG. 5.

The provision of the Cu foils 7 and 8 on the whole plane including the welding face is conducted so that the design freedom of the water channel increases and more complex form can be made. For example, as shown in FIG. 8, a plurality of cylindrical projections 11, 11 . . . can be positioned respectively in four water channels from the cooling water entrance 9 to the cooling water exit 10. The presence of the cylindrical projections 11, 11 . . . in the flow path produces turbulent flow which increases the effective surface area and thereby increases the cooling efficiency.

Figure 9:
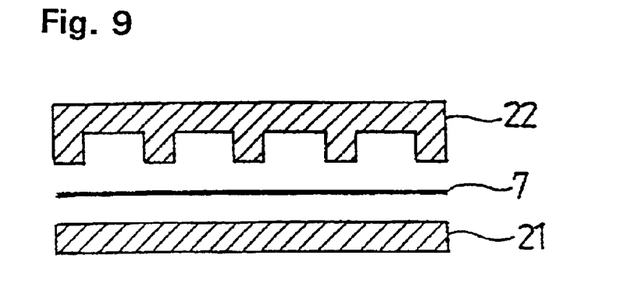
FIG. 9 is a transverse exploded sectional view showing still another embodiment of the invention.

As shown in FIG. 9, even when the conventional grooved backing plate composed of the substrate 21 and the cover member 22 is used, the welding operation can be conducted as described above using Cu or Zr foil or powder 7 to effect the weld.

Figure 10:
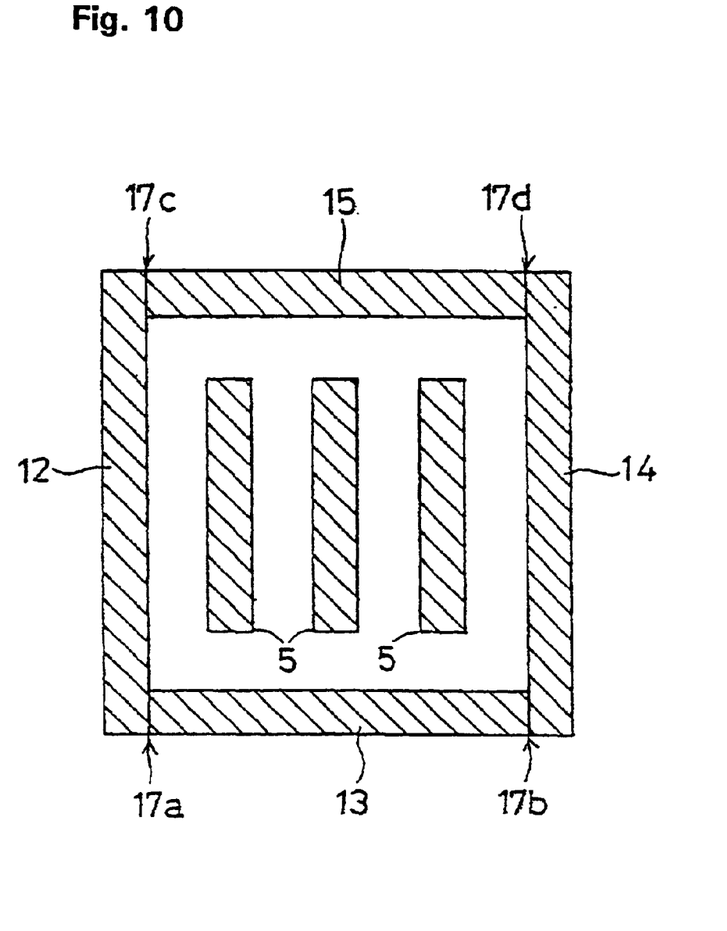
FIG. 10 is a central axial cross section of the embodiment of the invention in FIG. 9.

The components of the backing plate can be manufactured by further division thereof with the use of such a liquid phase diffusion welding operation as described in this invention. For example, as shown in FIG. 10, the outer frame member 4 can be manufactured as four separate rod-shaped members 12, 13, 14 and 15 having a rectangular or square cross section, with four welding faces 17a through 17d. The welding faces 17a through 17d are welded as shown, according to the above description, thus improving the yield of the components.

Figure 11:
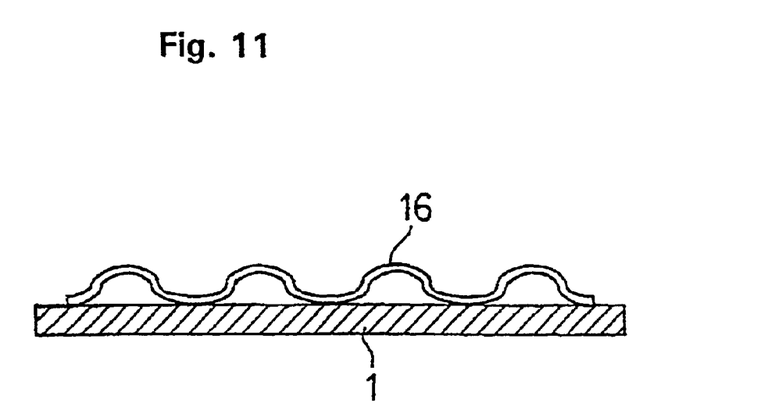
FIG. 11 is a transverse sectional view showing a further embodiment of the invention.

As another embodiment, as shown in FIG. 11, the cover-block member 16, formed integrally by press-working the cover member 16. The cover member 16 is welded to the surface of the substrate 1 using Cu or Zr foil or powder. By using such an integrally formed member 16, complex shaped water channels can be realized with low price and ease, and can be made thinner.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A backing plate comprising:
   at least first and second components;
   said first and second components being of a Ti material;
   a first welding face on said first component;
   a second welding face on said second component;
   said first and second welding faces being welded to each other to form a weld between said first and second welding faces; and
   said weld including a second metallic material diffused though said first and second welding faces, and leaving substantially none of said second material between said first and second welding faces wherein said second metallic material is selected from the group consisting of Cu material or Zr material.

2. A backing plate according to claim 1 further comprising:
- a substrate for mounting a target material on a first surface;
- a cover member on a second surface of said substrate;
- a block member interposed between said substrate and said cover member;
- said block member being welded to said substrate and said cover member; and
- said block member forming, with said substrate and said cover member, at least one cooling water channel.

3. A backing plate according to claim 2, wherein said cover member and said block member are integrally formed of one sheet.

4. A process for joining at least two components of Ti material comprising:

- interposing a Cu material on a welding face between said two components;
- heating said two components and said Cu material to a welding temperature at which said Cu material is liquefied;
- maintaining said welding temperature for a sufficient time to permit a substantial diffusion of said Cu material into said two components; and
- said substantial diffusion being sufficient to substantially remove liquid Cu material from said welding face by said diffusion of said Cu into said Ti material;
- wherein the step of heating includes heating to a temperature of from about 990° C. to about 1670° C.

* * * * *